US005995740A

United States Patent [19]
Johnson

[11] Patent Number: 5,995,740
[45] Date of Patent: Nov. 30, 1999

[54] METHOD FOR CAPTURING ASIC I/O PIN DATA FOR TESTER COMPATIBILITY ANALYSIS

[75] Inventor: Scott D. Johnson, Fort Collins, Colo.

[73] Assignee: LSI Logic Corporation, Milpitas, Calif.

[21] Appl. No.: 08/773,469

[22] Filed: Dec. 23, 1996

[51] Int. Cl.$^6$ .............................. G06F 13/20; G06F 9/455
[52] U.S. Cl. ................................ 395/500.41; 395/500.34; 395/500.36
[58] Field of Search ............................ 364/578; 395/500, 395/500.34, 500.35, 500.36, 500.41; 371/22.3, 24, 22.1; 710/20, 21, 31, 40, 107

[56] References Cited

U.S. PATENT DOCUMENTS

| | | | |
|---|---|---|---|
| 4,488,354 | 12/1984 | Chan et al. | 29/830 |
| 4,683,384 | 7/1987 | Shibata et al. | 307/475 |
| 4,744,084 | 5/1988 | Beck et al. | 371/23 |
| 4,791,357 | 12/1988 | Hyduke | 324/73 |
| 4,821,173 | 4/1989 | Young | 364/200 |
| 4,937,827 | 6/1990 | Beck et al. | 371/23 |
| 4,942,317 | 7/1990 | Tanaka et al. | 307/465 |
| 4,978,633 | 12/1990 | Seefeldt et al. | 437/51 |
| 4,980,889 | 12/1990 | DeGuise et al. | 371/22.3 |
| 5,105,373 | 4/1992 | Rumsey et al. | 364/578 |
| 5,166,937 | 11/1992 | Blecha, Jr. | 371/22.5 |
| 5,300,835 | 4/1994 | Assar et al. | 307/475 |
| 5,317,698 | 5/1994 | Chan | 395/325 |
| 5,406,147 | 4/1995 | Coyle et al. | 327/51 |
| 5,426,591 | 6/1995 | Ginetti et al. | 264/489 |
| 5,426,739 | 6/1995 | Lin et al. | 395/325 |
| 5,426,770 | 6/1995 | Nuber | 395/500.36 |
| 5,428,525 | 6/1995 | Hsieh et al. | 395/275 |
| 5,452,229 | 9/1995 | Shankar et al. | 364/489 |
| 5,455,928 | 10/1995 | Herlitz | 395/500.34 |
| 5,479,123 | 12/1995 | Gist et al. | 327/108 |
| 5,481,484 | 1/1996 | Ogawa et al. | 364/578 |
| 5,535,223 | 7/1996 | Horstmann et al. | 371/27 |
| 5,572,437 | 11/1996 | Rostoker et al. | 364/489 |
| 5,586,265 | 12/1996 | Beukema | 395/200.47 |

FOREIGN PATENT DOCUMENTS

4273382  8/1993  Japan.

OTHER PUBLICATIONS

A VHDL Standard Package for Logic Modeling; David R. Coelho; pp. 25–32; Jun., 1990.

Can Logic Simulators Handle Bidirectionality and Charge Sharing?; Prathima Agrawal et al.; pp. 411–414; 1990.

IBM Technical Disclosure Bulletin; vol. 30, No. 4; Sep., 1987; Testing Multiple Discrete Software Components by Connecting Real & Simulated Hardware Components; pp. 1844–1845.

An Emulator for CMOS ASICS; Roderic Beresford; VLSI Systems Design; May 4, 1987; p. I.

Webster, B. A, "An Inetgrated Analog Test Simulation Environment", Proceedings, International Test Conference, pp. 567–571, Aug. 1989.

*Primary Examiner*—Kevin J. Teska
*Assistant Examiner*—Douglas W. Sergent

[57] ABSTRACT

The present invention includes a modeling and testbench creation methodology which will allow a simulator to provide information regarding the state and direction of a bi-directional pad or pin. The present invention provides ATE tools all of the required data used to accurately and efficiently check for tester compatibility for which test patterns are extracted. In particular, the present invention includes a method of modeling a bi-directional I/O pad that includes the steps of providing a first signal in a first model; providing a second signal in a second model; and determining contention and direction of a resolved signal that is generated in response to at least one of the input and output signals. The first signal is a preferred output signal that is contained within an ASIC (first) model. The second signal is a preferred input signal that is contained within a testbench (second) model.

2 Claims, 2 Drawing Sheets

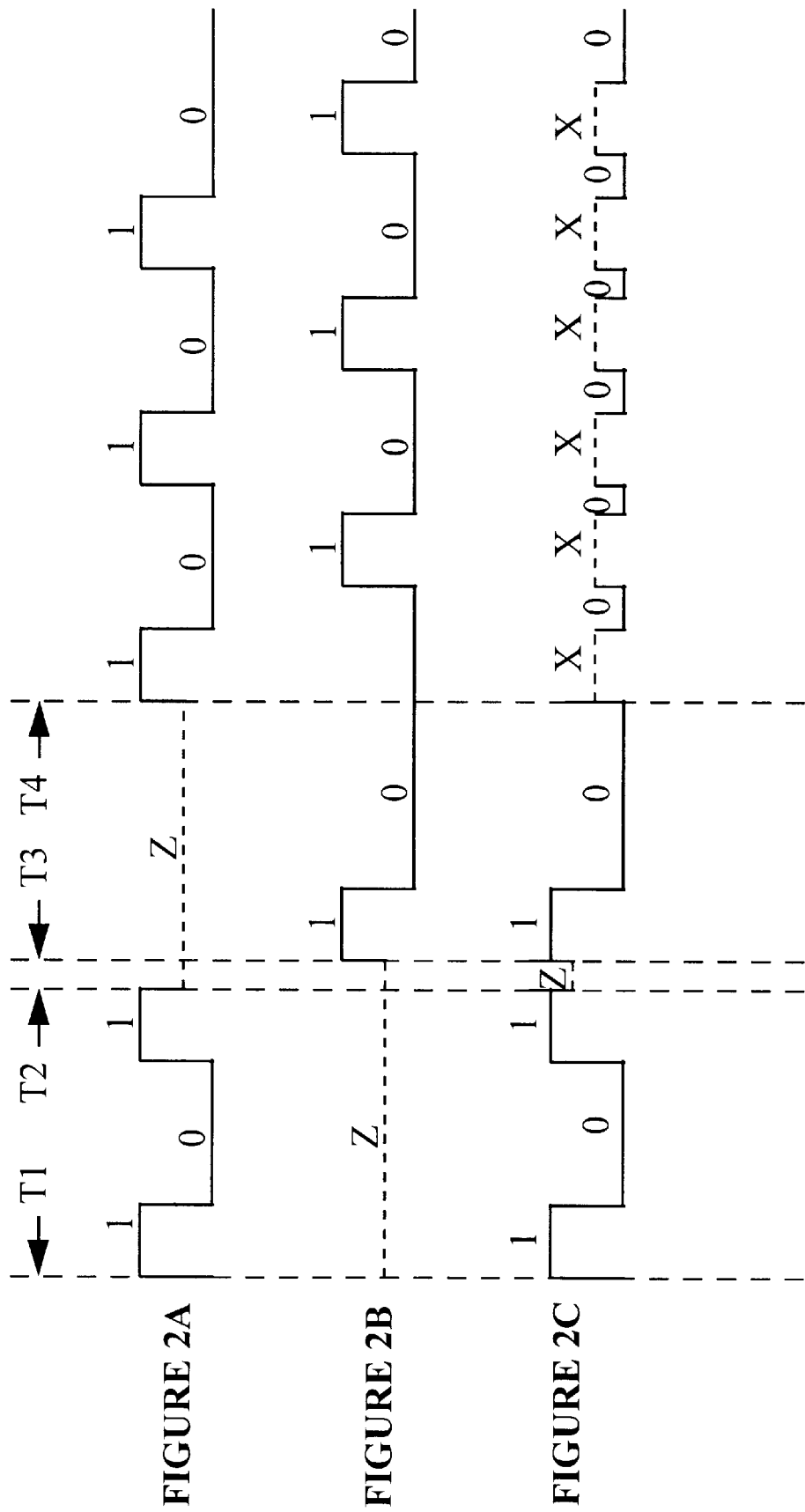

5,995,740

METHOD FOR CAPTURING ASIC I/O PIN DATA FOR TESTER COMPATIBILITY ANALYSIS

FIELD OF THE INVENTION

The present invention relates to a method of testing an application specific integrated circuit and particularly to analyzing bi-directional signals of an ASIC model in a digital simulator.

BACKGROUND OF THE INVENTION

The design flow for application specific integrated circuits (ASICs) requires that a representation of a ASIC design, typically a netlist that describes connectivity and primitive cell instances, be simulated functionally and for timing values. This simulation is usually accomplished by using a digital simulator prior to manufacturing the physical ASIC. A digital simulator is capable of simulating any timing values that a designer of the ASIC may wish to exercise on the ASIC model via a "testbench." A testbench is a set of stimuli applied to the inputs of the ASIC model. The expected data from these stimuli are strobed from the outputs of the ASIC model during, simulation in the digital simulator.

Whereas the digital simulator is capable of simulating any timing values, automated test equipment (ATE), which is used later to test the actual physical ASIC, have very strict restrictions on what types of timing values are allowable. Since the test patterns used on the ATE are based primarily upon the digital simulations, a method is needed for ensuring that the digital simulations intended for use on the ATE are compatible with these restrictions. One of the most complex tasks in analyzing for ATE compatibility is determining the direction of bi-directional pads at any point in time (i.e. as an output when the ASIC device is driving or when neither the device nor the external components (ATE or tester) is driving, or as an input when the tester is driving data onto the pad).

All ASIC vendors require some kind of extraction of simulation data to create test patterns and all ASIC vendors must ensure tester (ATE) compatibility. As ASIC designs become more complex, and testbenches represent the system more accurately, these vendors will need to adopt methodologies to aid their designers in quick conversion of simulations to test patterns.

A previous model is disclosed in copending patent application Ser. No. 08/299,395, incorporated herein by reference. Previous methods have the following disadvantages: require more complex digital models of all bi-directional pads; more complex testing methods for each model of the bi-directional pads; are typically a non-industry standard methodology; cause multiple iterations of simulation for designers using a design kit; and create an overall more complex design flow by forcing designers to maintain multiple databases for different industry standard third party tools.

The present invention solves the problem of how to provide enough information to any set of tools which could be written to analyze bi-directional pin data for ATE test pattern extraction from digital simulation.

SUMMARY OF THE INVENTION

The present invention includes a modeling and testbench creation methodology which will allow a simulator (such as Cadence Design Systems' Verilog-XL and VITAL compliant VHDL simulator's such as Mentor Graphic's QuickHDL Pro) to provide information regarding the state and direction of a bi-directional pad or pin. The present invention provides ATE tools all of the required data used to accurately and efficiently check for tester compatibility for which test patterns are extracted.

In particular, the present invention includes a method of modeling a bi-directional I/O pad that includes the steps of providing a first signal in a model; providing a second signal in a test bench; and determining contention and direction of a resolved signal that is generated in response to at least one of the input and output signals. The first signal is a output signal that is contained within an ASIC (first) model. The second signal is a preferred input signal that is contained within a testbench (second) model.

Numerous other advantages and features of the present invention will become readily apparent from the following detailed description of the invention and the embodiments thereof, from the claims and from the accompanying drawings in which details of the invention are fully and completely disclosed as a part of this specification.

BRIEF DESCRIPTION OF THE DRAWINGS

In the drawings,

FIGS. 2A–C are timing diagrams of signals shown in FIG. 1.

DETAILED DESCRIPTION OF THE PREFERRED EMBODIMENTS

Figure 1:
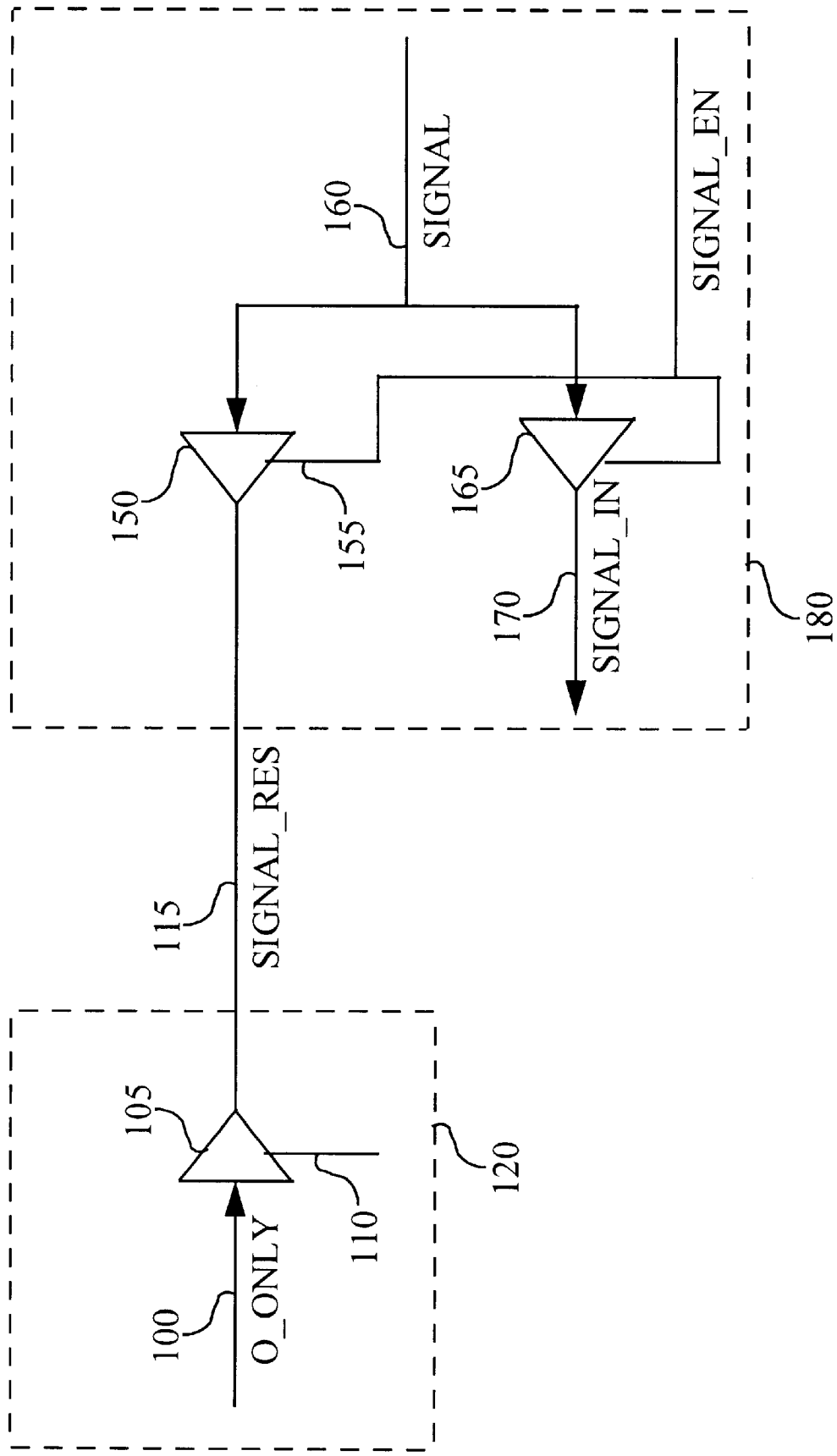
FIG. 1 is a schematic representation of an I/O pin model according to the present invention.

While this invention is susceptible of embodiment in many different forms, there is shown in the drawings and will be described herein in detail a specific embodiment thereof with the understanding that the present disclosure is to be considered as an exemplification of the principles of the invention and is not to be limited to the specific embodiment described.

FIG. 1 illustrates a model of a bi-directional I/O pin according to the present invention. A lead 100 is coupled to a tristate buffer 105 that is coupled to an enable lead 110. A lead 115 is coupled to tristate buffer 105. Leads 100 and 110, tristate buffer 105 and a portion of lead 115 are preferably contained in a model of an ASIC, denoted by dashed block 120.

Conventionally, these components and the rest of the ASIC (not shown) are modeled in software, such as HDL. As such, the leads of the present invention are known as "nets" and the tristate buffer is known as a "primitive cell."

Lead 115 is coupled to a tristate buffer 150 that is coupled to an enable lead 155. Tristate buffer 150 is also coupled to a lead 160 that is coupled to another tristate buffer 165. Tristate buffer 165 is coupled to a lead 170 and the same enable lead 155. Tristate buffers 150, 165, leads 160 and 170 and another portion of lead 115 are preferably contained in a "testbench," which preferably is a model of circuitry or a system to which the ASIC, once made, will be coupled. Again, conventionally, these components and the rest of the testbench are also modeled in software, such as HDL, where the leads are known as "nets" and the tristate buffers are known as "primitive cells."

In the present invention, as shown in FIG. 1, the model of the output driver portion of a bi-directional pad (leads 100, 110 and tristate buffer 105) includes a signal internal to the model. Preferably, this model should not have a port to this signal since the port does not exist in the physical cell. This signal, referenced as O_ONLY on lead 100, provides information about its contribution to the signal on the I/O pad that is provided on lead 115. In other words, this signal represents the output only data from the ASIC model.

It is preferred that the O_ONLY signal is isolated from any signal which may be driven by the testbench (representing either the tester or the system which the ASIC will be incorporated). Furthermore, all delays from any input pin of ASIC 120 to the external physical port representing the pad's connection to the external world (lead 115) preferably are mapped to this isolated signal as well. An advantage of the present invention as shown in FIG. 1 is that this modeling methodology is usable by all third party standard design tools. Since O_ONLY signal remains internal to the model, other tools (that are not used for simulation) will not "see" this internal signal when the netlist is read. Therefore, this signal will not adversely affect the overall design flow and will be transparent to other industry standard design flows.

In testbench 180, two additional signals are provided. The first additional signal is analogous to the output only signal required in the ASIC model 120, and it is the input only side. In other words, it represents the contribution of testbench 180 (again representing either the system or the test environment) to a SIGNAL_RES on lead 115. This signal is referenced as SIGNAL_IN and is provided on lead 170. The second additional signal is the "resolved" signal, which results from the contributions of both the external testbench and from the ASIC device itself (the SIGNAL_IN and O_ONLY signals, respectively). This resolved signal is referenced as SIGNAL_RES on lead 115. A designer can use the resolved signal to monitor and control the testbench. To this end, O_ONLY and SIGNAL_IN signals are strobed in an output log file. Other tools (such as the Verify tool in the Symbios Logic Design Test suite of tools, available from Symbios Logic Inc.) can then analyze O_ONLY, SIGNAL_IN and SIGNAL_RES to determine signal direction and any contention areas if both ASIC 120 and testbench 180 are simultaneously driving lead 115. The contention can be either "same state" or "opposite state" contention.

The operation of the present invention will be explained by reference to FIG. 1. In testbench 180, a SIGNAL signal is used to control the value of the data driven on lead 115.

SIGNAL_RES is the resolution between what the pad of ASIC 120 is driving and what the external world (testbench) is driving. SIGNAL_IN is a "floating" net in the testbench which represents the input only side of the bi-directional data SIGNAL_EN. Lead 155 provides a control enable signal for testbench 180 to allow the designer to start and stop driving data based on the data direction of lead 115.

Referring to FIGS. 2A–C, a more detailed explanation of the operation of the present invention will be provided. FIG. 2A represents O_ONLY, FIG. 2B represents SIGNAL_IN and FIG. 2C represents SIGNAL_RES. During simulation of the ASIC, O_ONLY is controlled as shown between times T1 and T2 in FIG. 2A. Tristate buffers 150 and 165 are disabled, which is represented by the high impedance Z between times T1 and T2 in FIG. 2B. As a result, SIGNAL_RES follows O_ONLY as shown between times T1 and T2 of FIG. 2C.

During further simulation of the ASIC, tristate buffer 105 is disabled by a signal on lead 110 and provides the high impedance Z as shown between times T3 and T4. Tristate buffers 150 and 165 are enabled and SIGNAL_IN is represented by the waveform between times T3 and T4 in FIG. 2B. As a result, SIGNAL_RES follows SIGNAL_IN as shown between times T3 and T4 of FIG. 2C.

When both O_ONLY and SIGNAL_IN are driven as shown after time T4 in FIGS. 2A and 2B, the simulator cannot determine SIGNAL_RES. Therefore, the simulator saves the waveform as shown in FIG. 2C after time T4. The waveforms shown in FIGS. 2A–C are used to determine if the ASIC design is ATE compatible.

It should be noted that lead 115 of the present invention is typically coupled to, for example, input buffers respectively located in the ASIC 120.

The model of the present invention, along with the test bench, can be stored on physical media, such as a magnetic or optical disk (but not limited thereto). The model and test bench are then compiled into a computer RAM and executed by a simulator on the computer's CPU. A computer includes a PC or a workstation.

Numerous variations and modifications of the embodiment described above may be effected without departing from the spirit and scope of the novel features of the invention. For example, pull-up or pull-down resistors may be coupled to lead 115. It is to be understood that no limitations with respect to the specific device illustrated herein are intended or should be inferred. It is, of course, intended to cover by the appended claims all such modifications as fall within the scope of the claims.

I claim:

1. A method of modeling a bi-directional I/O pad comprising the steps of:
   providing a first signal in an ASIC model, said first signal representing an output only signal from the ASIC model and being isolated from signals driven by a testbench model;
   providing a second signal in the testbench model, said second signal representing an output only signal from the testbench model and being isolated from signals driven by the ASIC model;
   determining a direction of a resolved signal shared by said ASIC model and said testbench model, said resolved signal having a state which depends on states of said first signal in the ASIC model and said second signal in the testbench model.

2. The method of claim 1 further comprising the step of determining contention of the resolved signal.

* * * * *